(12) United States Patent
Marsden et al.

(10) Patent No.: US 9,454,270 B2
(45) Date of Patent: Sep. 27, 2016

(54) SYSTEMS AND METHODS FOR DETECTING A PRESS ON A TOUCH-SENSITIVE SURFACE

(75) Inventors: Randal J. Marsden, Edmonton (CA); Steve Hole, Edmonton (CA); Daniel Closson, Edmonton (CA)

(73) Assignee: APPLE INC., Cupertino, CA (US)

( * ) Notice: Subject to any disclaimer, the term of this patent is extended or adjusted under 35 U.S.C. 154(b) by 104 days.

(21) Appl. No.: 13/442,855

(22) Filed: Apr. 10, 2012

(65) Prior Publication Data

US 2013/0093715 A1   Apr. 18, 2013

Related U.S. Application Data

(63) Continuation-in-part of application No. 12/234,053, filed on Sep. 19, 2008, now Pat. No. 8,325,141.

(51) Int. Cl.
*G06F 3/044* (2006.01)
*G06F 3/023* (2006.01)
*H03K 17/96* (2006.01)
*G06F 3/041* (2006.01)

(52) U.S. Cl.
CPC .............. *G06F 3/044* (2013.01); *G06F 3/023* (2013.01); *G06F 3/0231* (2013.01); *H03K 17/962* (2013.01); *G06F 3/0414* (2013.01); *H03K 2217/94052* (2013.01); *H03K 2217/960775* (2013.01)

(58) Field of Classification Search
CPC .............................. G06F 3/044; G06F 3/0414
USPC ........................................................ 345/168
See application file for complete search history.

(56) References Cited

U.S. PATENT DOCUMENTS

| | | |
|---|---|---|
| 4,725,694 A | 2/1988 | Auer et al. |
| 4,805,222 A | 2/1989 | Young et al. |
| 5,404,458 A | 4/1995 | Zetts |
| 5,416,498 A | 5/1995 | Grant |
| 6,029,578 A | 2/2000 | Weil et al. |
| 6,396,483 B1 | 5/2002 | Hiller |
| 6,492,979 B1 | 12/2002 | Kent et al. |
| 6,504,530 B1 | 1/2003 | Wilson et al. |

(Continued)

FOREIGN PATENT DOCUMENTS

| | | |
|---|---|---|
| CN | 1666170 A | 9/2005 |
| CN | 101036105 A | 9/2007 |

(Continued)

OTHER PUBLICATIONS

Office Action, dated May 15, 2015, received in U.S. Appl. No. 13/308,428, 26 pages.

(Continued)

*Primary Examiner* — Quan-Zhen Wang
*Assistant Examiner* — Xuemei Zheng
(74) *Attorney, Agent, or Firm* — Morgan, Lewis & Bockius LLP

(57) ABSTRACT

Systems and methods that allow the user to rest their fingers on a touch-sensitive surface and make selections on that surface with a pressing action. Touch capacitance sensors that typically provide X and Y location data associated with a user's touch are also used to discern finger pressure in the Z direction. This allows the user to make an actuation on the touch screen by simply pressing harder at a location where they may already be resting their finger(s).

17 Claims, 7 Drawing Sheets

Press Detection Data Flow:

(56) References Cited

U.S. PATENT DOCUMENTS

| | | |
|---|---|---|
| 6,525,717 B1 | 2/2003 | Tang |
| 6,563,492 B1 | 5/2003 | Furuya |
| 6,625,460 B1 | 9/2003 | Patil |
| 6,650,318 B1 | 11/2003 | Arnon |
| 6,657,616 B2 | 12/2003 | Sims |
| 6,707,448 B1 | 3/2004 | Kunimatsu et al. |
| 6,762,749 B1 | 7/2004 | Gouzman et al. |
| 7,257,528 B1 | 8/2007 | Ritchie et al. |
| 7,309,829 B1 | 12/2007 | Ludwig |
| 7,339,580 B2 | 3/2008 | Westerman et al. |
| 7,499,039 B2 | 3/2009 | Roberts |
| 7,554,529 B2 | 6/2009 | Kotipalli |
| 7,557,312 B2 | 7/2009 | Clark et al. |
| 7,659,885 B2 | 2/2010 | Kraus et al. |
| 7,663,607 B2 | 2/2010 | Hotelling et al. |
| 7,768,501 B1 | 8/2010 | Maddalozzo, Jr. et al. |
| 7,813,774 B2 | 10/2010 | Perez-Noguera |
| 8,019,390 B2 | 9/2011 | Sindhu |
| 8,350,820 B2 | 1/2013 | Deslippe et al. |
| 8,390,572 B2 | 3/2013 | Marsden et al. |
| 8,624,841 B2 | 1/2014 | Kim et al. |
| 8,716,585 B2 | 5/2014 | Ludwig |
| 2002/0005108 A1 | 1/2002 | Ludwig |
| 2002/0005111 A1 | 1/2002 | Ludwig |
| 2002/0033285 A1 | 3/2002 | Afanasiev |
| 2002/0033795 A1 | 3/2002 | Shahoian et al. |
| 2002/0095586 A1 | 7/2002 | Doyle et al. |
| 2002/0140667 A1 | 10/2002 | Horiki |
| 2003/0063073 A1* | 4/2003 | Geaghan et al. ............ 345/173 |
| 2003/0071858 A1 | 4/2003 | Morohoshi |
| 2003/0122784 A1 | 7/2003 | Shkolnikov |
| 2003/0206162 A1 | 11/2003 | Roberts |
| 2003/0235452 A1 | 12/2003 | Kraus et al. |
| 2004/0004559 A1 | 1/2004 | Rast |
| 2004/0108995 A1 | 6/2004 | Hoshino et al. |
| 2004/0125086 A1 | 7/2004 | Hagermoser et al. |
| 2005/0059418 A1 | 3/2005 | Northcutt |
| 2005/0063757 A1 | 3/2005 | Sugimura et al. |
| 2005/0104867 A1 | 5/2005 | Westerman et al. |
| 2005/0120870 A1 | 6/2005 | Ludwig |
| 2005/0121980 A1 | 6/2005 | Bruwer |
| 2005/0122313 A1 | 6/2005 | Ashby |
| 2005/0122322 A1 | 6/2005 | Furuya et al. |
| 2005/0162402 A1* | 7/2005 | Watanachote ............. 345/173 |
| 2005/0179565 A1 | 8/2005 | Mase et al. |
| 2005/0190970 A1 | 9/2005 | Griffin |
| 2005/0246652 A1 | 11/2005 | Morris |
| 2006/0097991 A1 | 5/2006 | Hotelling et al. |
| 2006/0114238 A1 | 6/2006 | Wong et al. |
| 2006/0139312 A1* | 6/2006 | Sinclair et al. ............. 345/156 |
| 2006/0152497 A1 | 7/2006 | Rekimoto |
| 2006/0152499 A1 | 7/2006 | Roberts |
| 2006/0180450 A1 | 8/2006 | Clark et al. |
| 2006/0192763 A1 | 8/2006 | Ziemkowski |
| 2006/0232558 A1 | 10/2006 | Chien |
| 2006/0238503 A1 | 10/2006 | Smith et al. |
| 2006/0274042 A1 | 12/2006 | Krah et al. |
| 2006/0274920 A1 | 12/2006 | Tochikubo et al. |
| 2006/0279548 A1 | 12/2006 | Geaghan |
| 2006/0284858 A1 | 12/2006 | Rekimoto |
| 2007/0024593 A1 | 2/2007 | Schroeder |
| 2007/0040813 A1 | 2/2007 | Kushler et al. |
| 2007/0047702 A1 | 3/2007 | Newell et al. |
| 2007/0060131 A1 | 3/2007 | Wilson |
| 2007/0091070 A1 | 4/2007 | Larsen et al. |
| 2007/0096930 A1 | 5/2007 | Cardoso |
| 2007/0120762 A1 | 5/2007 | O'Gorman |
| 2007/0120832 A1 | 5/2007 | Saarinen et al. |
| 2007/0139382 A1 | 6/2007 | Kotipalli |
| 2007/0139395 A1 | 6/2007 | Westerman et al. |
| 2007/0216658 A1 | 9/2007 | Rainisto |
| 2007/0229466 A1* | 10/2007 | Peng et al. ............. 345/173 |
| 2007/0229476 A1 | 10/2007 | Huh |
| 2007/0236478 A1 | 10/2007 | Geaghan et al. |
| 2007/0247316 A1 | 10/2007 | Wildman et al. |
| 2007/0247429 A1 | 10/2007 | Westerman |
| 2007/0294263 A1 | 12/2007 | Punj et al. |
| 2008/0018614 A1 | 1/2008 | Rekimoto |
| 2008/0042978 A1 | 2/2008 | Perez-Noguera |
| 2008/0042989 A1 | 2/2008 | Westerman |
| 2008/0122796 A1 | 5/2008 | Jobs et al. |
| 2008/0146082 A1 | 6/2008 | Lin et al. |
| 2008/0150905 A1 | 6/2008 | Grivna et al. |
| 2008/0170046 A1 | 7/2008 | Rimon et al. |
| 2008/0225006 A1 | 9/2008 | Ennadi |
| 2008/0237021 A1 | 10/2008 | Struve |
| 2008/0270558 A1 | 10/2008 | Ma |
| 2008/0273013 A1 | 11/2008 | Levine et al. |
| 2008/0281923 A1 | 11/2008 | Barchi |
| 2008/0289887 A1 | 11/2008 | Flint et al. |
| 2008/0309519 A1 | 12/2008 | Bengtsson et al. |
| 2009/0002217 A1 | 1/2009 | Kryze et al. |
| 2009/0009482 A1* | 1/2009 | McDermid ............. 345/173 |
| 2009/0016000 A1 | 1/2009 | Kobayashi |
| 2009/0045700 A1 | 2/2009 | Sasaki et al. |
| 2009/0046110 A1* | 2/2009 | Sadler et al. ............. 345/660 |
| 2009/0051447 A1 | 2/2009 | McCracken et al. |
| 2009/0073128 A1 | 3/2009 | Marsden |
| 2009/0091458 A1 | 4/2009 | Deutsch |
| 2009/0207574 A1 | 8/2009 | Chen et al. |
| 2009/0225041 A1 | 9/2009 | Kida et al. |
| 2009/0226091 A1 | 9/2009 | Goldsmith et al. |
| 2009/0237254 A1 | 9/2009 | Munro et al. |
| 2009/0237359 A1 | 9/2009 | Kim et al. |
| 2009/0273477 A1 | 11/2009 | Barnhill |
| 2009/0273571 A1 | 11/2009 | Bowens |
| 2009/0282917 A1 | 11/2009 | Acar |
| 2009/0284476 A1 | 11/2009 | Bull et al. |
| 2010/0020043 A1 | 1/2010 | Park et al. |
| 2010/0042827 A1 | 2/2010 | Pratt et al. |
| 2010/0045705 A1 | 2/2010 | Vertegaal et al. |
| 2010/0060585 A1 | 3/2010 | Chiu |
| 2010/0064244 A1 | 3/2010 | Kilpatrick, II et al. |
| 2010/0065640 A1 | 3/2010 | Maeda et al. |
| 2010/0085382 A1 | 4/2010 | Lundqvist et al. |
| 2010/0101921 A1 | 4/2010 | Howie et al. |
| 2010/0103139 A1 | 4/2010 | Soo et al. |
| 2010/0153879 A1* | 6/2010 | Rimas-Ribikauskas et al. ............. 715/810 |
| 2010/0177057 A1 | 7/2010 | Flint et al. |
| 2010/0194692 A1 | 8/2010 | Orr et al. |
| 2010/0220061 A1 | 9/2010 | Bos et al. |
| 2010/0323762 A1 | 12/2010 | Sindhu |
| 2011/0037734 A1 | 2/2011 | Pance et al. |
| 2011/0043475 A1 | 2/2011 | Rigazio et al. |
| 2011/0050576 A1 | 3/2011 | Forutanpour et al. |
| 2011/0068930 A1 | 3/2011 | Wildman et al. |
| 2011/0126141 A1 | 5/2011 | King et al. |
| 2011/0227740 A1 | 9/2011 | Wohltjen |
| 2011/0316703 A1 | 12/2011 | Butler et al. |
| 2011/0316784 A1 | 12/2011 | Bisutti et al. |
| 2012/0056814 A1 | 3/2012 | Sudo |
| 2012/0062382 A1 | 3/2012 | Taneff |
| 2012/0075192 A1 | 3/2012 | Marsden et al. |
| 2012/0075193 A1 | 3/2012 | Marsden et al. |
| 2012/0112906 A1 | 5/2012 | Borke et al. |
| 2012/0113028 A1 | 5/2012 | Marsden et al. |
| 2012/0117506 A1 | 5/2012 | Koch et al. |
| 2012/0133589 A1 | 5/2012 | Marsden et al. |
| 2012/0167170 A1 | 6/2012 | Shi et al. |
| 2012/0206384 A1 | 8/2012 | Marsden et al. |
| 2012/0260207 A1 | 10/2012 | Treskunov et al. |
| 2012/0306758 A1 | 12/2012 | Marsden et al. |
| 2013/0021248 A1 | 1/2013 | Eleftheriou |
| 2013/0187775 A1 | 7/2013 | Marsden et al. |
| 2013/0265273 A1 | 10/2013 | Marsden et al. |
| 2014/0028624 A1 | 1/2014 | Marsden et al. |
| 2014/0035824 A1 | 2/2014 | Bernstein et al. |
| 2015/0049059 A1 | 2/2015 | Zadesky et al. |

(56) References Cited

U.S. PATENT DOCUMENTS

| | | |
|---|---|---|
| 2015/0067571 A1 | 3/2015 | Marsden |
| 2015/0324116 A1 | 11/2015 | Marsden et al. |

FOREIGN PATENT DOCUMENTS

| | | | |
|---|---|---|---|
| JP | 63311521 | A | 12/1988 |
| JP | 07-306752 | A | 11/1995 |
| JP | 10-208110 | | 8/1998 |
| JP | 11-085352 | | 3/1999 |
| JP | 11-136116 | | 5/1999 |
| JP | 11-136116 | A | 5/1999 |
| JP | 2002297316 | A | 10/2002 |
| JP | 2004265383 | A | 9/2004 |
| JP | 2005204251 | A | 7/2005 |
| JP | 2005531861 | A | 10/2005 |
| JP | 2007-184006 | A | 7/2006 |
| JP | 2006323589 | A | 11/2006 |
| JP | 2007-184008 | A | 7/2007 |
| JP | 2008-544352 | A | 12/2008 |
| JP | 2009-520271 | A | 5/2009 |
| KR | 20040106552 | A | 12/2004 |
| KR | 20090060888 | A | 6/2009 |
| KR | 20090101741 | A | 9/2009 |
| KR | 10-2010-0012321 | A | 2/2010 |
| KR | 20100029026 | A | 3/2010 |
| KR | 20100029421 | A | 3/2010 |
| KR | 2010-0065640 | A | 6/2010 |
| WO | WO 2006/039033 | A2 | 4/2006 |
| WO | WO 2006/088752 | A2 | 8/2006 |
| WO | WO 2006/133018 | A2 | 12/2006 |
| WO | WO 2007/144014 | A1 | 12/2007 |

OTHER PUBLICATIONS

Notice of Allowance, dated Apr. 23, 2015, received in U.S. Appl. No. 13/355,450, 12 pages.
Notice of Allowance, dated May 15, 2015, received in U.S. Appl. No. 13/506,342, 8 pages.
International Search Report and Written Opinion dated Nov. 29, 2012, received in International Patent Application No. PCT/US2012/000199, which corresponds to U.S. Appl. No. 14/110,229, 7 pages.
International Preliminary Report on Patentability, dated Oct. 8, 2013, received in International Patent Application No. PCT/US2012/000199, which corresponds to U.S. Appl. No. 14/110,229, 5 pages.
Devlin Medical, CleanKey Keyboard, www.DevlinMedical.co.uk, Hampshire, UK, Sep. 3, 2009, 1 page.
Office Action dated Jul. 12, 2011, received in U.S. Appl. No. 12/234,053, 15 pages. (Marsden).
Final Office Action dated Dec. 8, 2011, received in U.S. Appl. No. 12/234,053, 20 pages.(Marsden).
Office Action dated Jun. 1, 2012, received in U.S. Appl. No. 12/234,053, 18 pages. (Marsden).
Notice of Allowance dated Sep. 17, 2012, received in U.S. Appl. No. 12/234,053, 7 pages. (Marsden).
Office Action dated Nov. 2, 2011, received in Chinese Patent Application No. 200880116618.7, which corresponds to U.S. Appl. No. 12/234,053, 2 pages. (Marsden).
Office Action dated Apr. 24, 2012, received in Chinese Patent Application No. 200880116618.7, which corresponds to U.S. Appl. No. 12/234,053, 7 pages. (Marsden).
Office Action dated Nov. 16, 2012, received in Chinese Patent Application No. 200880116618.7, which corresponds to U.S. Appl. No. 12/234,053, 7 pages. (Marsden).
Office Action dated May 9, 2013, received in Chinese Patent Application No. 200880116618.7, which corresponds to U.S. Appl. No. 12/234,053, 6 pages. (Marsden).
Office Action, dated Nov. 8, 2012, received in European Patent Application No. 08 832 204.5, which corresponds to U.S. Appl. No. 12/234,053, 5 pages. (Marsden).

Office Action dated Aug. 21, 2012, received in Japanese Patent Application No. 2010-525997, which corresponds to U.S. Appl. No. 12/234,053, 9 pages. (Marsden).
Final Office Action dated Jan. 22, 2013, received in Japanese Patent Application No. 2010-525997, which corresponds to U.S. Appl. No. 12/234,053, 10 pages. (Marsden).
Office Action dated Nov. 26, 2014, received in KR1020107008557, which corresponds to U.S. Appl. No. 12/234,053, 13 pages. (Marsden).
Office Action dated Aug. 26, 2013, received in U.S. Appl. No. 13/171,124, 12 pages. (Marsden).
Final Office Action dated May 29, 2014, received in U.S. Appl. No. 13/171,124, 11 pages. (Marsden).
Notice of Allowance dated Jan. 5, 2015, received in U.S. Appl. No. 13/171,124, 8 pages. (Marsden).
Office Action dated Mar. 12, 2015, received in U.S. Appl. No. 13,171,124, 13 pages. (Marsden).
Office Action dated Feb. 25, 2014, received in Japanese Patent Application No. JP 2013-518583, which corresponds to U.S. Appl. No. 13/171,124, 5 pages.
Office Action dated May 16, 2012, received in U.S. Appl. No. 13/365,719, 20 pages. (Marsden).
Final Office Action dated Oct. 19, 2012, received in U.S. Appl. No. 13/365,719, 9 pages. (Marsden).
Notice of Allowance dated Nov. 13, 2012, received in U.S. Appl. No. 13/365,719, 7 pages. (Marsden).
Office Action dated May 6, 2014, received in U.S. Appl. No. 13/308,416, 19 pages. (Marsden).
Final Office Action dated Jan. 30, 2015, received in U.S. Appl. No. 13/308,416, 38 pages. (Marsden).
Office Action dated Aug. 19, 2014, recevied in Japanese Patent Application No. 2013-542153, which corresponds to U.S. Appl. No. 13/308,416, 5 pages.
Office Action dated Nov. 12, 2014, recevied in Korean Patent Application No. 10-2013-7016964, which corresponds to U.S. Appl. No. 13/308,416, 3 pages. (Marsden).
Office Action dated May 2, 2014, received in U.S. Appl. No. 13/308,428, 12 pages. (Marsden).
Final Office Action dated Dec. 22, 2014, received in U.S. Appl. No. 13/308,428, 29 pages. (Marsden).
Office Action dated May 16, 2014, received in U.S. Appl. No. 13/355,450, 12 pages. (Marsden).
Final Office Action dated Nov. 7, 2014, received in U.S. Appl. No. 13/355,450, 22 pages. (Marsden).
Office Action dated Jan. 27, 2014, received in U.S. Appl. No. 13/506,342, 13 pages. (Marsden).
Notice of Allowance dated Nov. 21, 2014, received in U.S. Appl. No. 13/506,342, 8 pages. (Marsden).
Notice of Allowance dated Feb. 23, 2015, received in U.S. Appl. No. 13/506,342, 5 pages. (Marsden).
Office Action dated Jun. 18, 2013, received in U.S. Appl. No. 13/485,802, 11 pages. (Marsden).
Office Action dated Aug. 10, 2012, received in U.S. Appl. No. 13/485,802, 8 pages. (Marsden).
Final Office Action dated Dec. 10, 2012, received in U.S. Appl. No. 13/485,802, 11 pages. (Marsden).
Office Action dated Feb. 27, 2014, received in U.S. Appl. No. 13/747,469, 8 pages. (Marsden).
Office Action dated Sep. 25, 2014, received in U.S. Appl. No. 14/110,229, 34 pages. (Marsden).
Extended European Search Report, dated Mar. 19, 2012, received in European Patent Application No. 08832204.5, which corresponds to U.S. Appl. No. 12/234,053, 8 pages.
International Preliminary Report on Patentability dated Mar. 24, 2010, received in International Patent Application No. PCT/US2008/077007, which corresponds to U.S. Appl. No. 12/234,053, 4 pages.
International Search Report and Written Opinion dated Apr. 28, 2009, received in International Patent Application No. PCT/US2008/077007, which corresponds to U.S. Appl. No. 12/234,053, 5 pages.

(56) References Cited

OTHER PUBLICATIONS

International Search Report and Written Opinion dated Feb. 9, 2012, received in International Patent Application No. PCT/US2011/042225, which corresponds to U.S. Appl. No. 13/442,855, 6 pages. (Marsden).

International Preliminary Report on Patentability dated Dec. 28, 2012, received in International Patent Application No. PCT/US2011/042225, which corresponds to U.S. Appl. No. 13/442,855, 4 pages.

International Search Report and Written Opinion dated Jul. 30, 2012, received in International Patent Application No. PCT/US2011/062721, which corresponds to U.S. Appl. No. 13/308,416, 7 pages.

International Preliminary Report on Patentability dated Jun. 4, 2013, received in International Patent Application No. PCT/US2011/062721, which corresponds to U.S. Appl. No. 13/308,416, 5 pages.

International Preliminary Report on Patentability dated Jun. 4, 2013, received in International Patent Application No. PCT/US2011/062723, which corresponds to U.S. Appl. No. 13/308,428, 5 pages.

International Search Report and Written Opinion dated Jul. 20, 2012, received in International Patent Application No. PCT/US2011/062723, which corresponds to U.S. Appl. No. 13/308,428, 7 pages.

International Preliminary Report on Patentability dated Apr. 1, 2013, received in International Patent Application No. PCT/US2012/000210, which corresponds to U.S. Appl. No. 13/355,450, 7 pages.

International Search Report and Written Opinion dated Jul. 27, 2012, received in International Patent Application No. PCT/US2012/000210, which corresponds to U.S. Appl. No. 13/355,450, 7 pages.

International Search Report and Written Opinion dated Jan. 10, 2013, received in International Patent Application No. PCT/US2012/040296, which corresponds to U.S. Appl. No. 13/485,802, 7 pages.

International Preliminary Report on Patentability dated Dec. 2, 2013, received in International Patent Application No. PCT/US2012/040296, which corresponds to U.S. Appl. No. 13/485,802, 5 pages.

Notice of Allowance, dated Aug. 3, 2015, received in Japanese Patent Application No. 2010-525997, which corresponds with U.S. Appl. No. 12/234,053, 3 pages.

Office Action dated Apr. 28, 2015, received in Chinese Patent Application No. 201180039270.8, which corresponds with U.S. Appl. No. 13/171,124, 2 pages.

Notice of Allowance dated Jun. 30, 2015, received in U.S. Appl. No. 13/308,416, 9 pages.

Notice of Allowance, dated Jun. 30, 2015, received in Korean Patent Application No. 10-2013-7016964, which corresponds to U.S. Appl. No. 13/308,416, 8 pages.

Notice of Allowance, dated Jun. 29, 2015, received in U.S. Appl. No. 13/506,342, 8 pages.

Office Action, dated Oct. 1, 2015, received in U.S. Appl. No. 14/169,002, 13 pages.

Office Action, dated Sep. 24, 2015, received in U.S. Appl. No. 14/046,836, 10 pages.

Fu, "Touch Keyboard," Tianjin Funa Yuanchuang Technology Co Ltd, Jul. 4, 2012, 55 pages.

Notice of Allowance, dated Feb. 3, 2016, received in Chinese Patent Application No. 201180039270.8, which corresponds with U.S. Appl. No. 13/171,124, 2 pages.

Certificate of Patent, dated Mar. 16, 2016, received in Chinese Patent Application No. 201180039270.8, which corresponds with U.S. Appl. No. 13/171,124, 2 pages.

Notice of Allowance, dated Oct. 30, 2015, received in Japanese Patent Application No. 2013-518583, which corresponds with U.S. Appl. No. 13/171,124, 5 pages.

Office Action, dated Aug. 25, 2015, received in Chinese Patent Application No. 201180064220.5, which corresponds with U.S. Appl. No. 13/308,416, 2 pages.

Decision to Grant, dated May 4, 2016, received in Chinese Patent Application No. 201180064220.5, which corresponds with U.S. Appl. No. 13/308,416, 2 pages.

Letters Patent, dated Dec. 14, 2015, received in Korean Patent Application No. 10-2013-7016964, which corresponds to U.S. Appl. No. 13/308,416, 3 pages.

Office Action, dated Nov. 18, 2015, received in U.S. Appl. No. 13/308,428, 25 pages.

Final Office Action, dated Nov. 24, 2015, received in U.S. Appl. No. 13/308,428, 26 pages.

Final Office Action, dated May 3, 2016, received in U.S. Appl. No. 14/169,002, 12 pages.

Office Action, dated Nov. 24, 2015, received in U.S. Appl. No. 14/265,340, 15 pages.

Extended European Search Report, dated Feb. 29, 2016, received in European Patent Application No. 11804144.1, which corresponds to U.S. Appl. No. 13/171,124, 7 pages.

Supplementary European Search Report, dated Mar. 17, 2016, received in European Patent Application No. 11804144.1, which corresponds to U.S. Appl. No. 13/171,124, 8 pages.

\* cited by examiner

SYSTEMS AND METHODS FOR DETECTING A PRESS ON A TOUCH-SENSITIVE SURFACE

PRIORITY INFORMATION

The application claims priority to provisional application Ser. No. 61/472,799 filed Apr. 7, 2011 and is incorporated herein by reference.

FIELD OF INVENTION

The present invention relates to input devices for electronics and, more particularly, to a touch sensitive input surface especially suited to smartphones, tablet computers, touch sensitive keyboards, input panels, medical equipment, or any other device that uses a touch-sensitive panel or display.

BACKGROUND OF THE INVENTION

With the advent of touch-sensitive interfaces on the screen of computing devices, it has become necessary to find alternative human-computer interfaces to the traditional keyboard and mouse. Many of these devices, often referred to as tablet computers, smart phones, and smart screens, don't support the traditional input paradigms of an external keyboard and mouse. Rather, they rely on the direct input of the user through human touch.

Besides this type of computing device, there are also other touch-interface devices that use a similar mode for user input. One such example is that of a touch-sensitive computer keyboard that is made up of a solid touch-sensitive surface that can be easily wiped for cleaning purposes.

Traditionally, these touch sensitive surfaces respond immediately to the user's touch (or release). The paradigm is simple: point, touch, select. While this works well for many applications, it is problematic in situations where the user desires to rest their hands and/or fingers on the surface. A touch sensitive keyboard (onscreen or stand-alone) is a good example of such a situation; a trained ten-finger touch typist relies on resting their fingers on the home row of the keyboard and then pressing keys to initiate an action. On traditional touch surfaces, this isn't possible because as soon as the user touches the surface to rest their fingers, an action is initiated. These solutions don't take into account the need for the user to rest their hands/fingers on the surface.

There are many methods for detecting the touch of a human user, including sensors based on capacitance, infrared light, resistance, surface acoustic waves, and force sensors. Each of these methods have their respective advantages and disadvantages. But the vast majority of today's touch-based systems have standardized on using touch capacitance.

An example of one of the first uses of a touch capacitance for computer input is described in U.S. Pat. No. 5,305,017 to Gerpheide. This approach has become the standard for providing a cursor-pointing alternative to a computer mouse in the form of a touchpad, commonly included in most laptop computers. The method decodes touches in two dimensions, offering offsets in the horizontal (x) direction and vertical (y) direction as the user moves their finger across the touchpad surface. However, no consideration is given to user assertions in the vertical (-z) direction.

This approach to sensing human touch using changes in capacitance is commonly employed in the industry. Electronic chips are readily available to perform these functions, such as the QT60486 from Quantum Research Group and the AT32UCL3L from Atmel Corporation. These chips, and others like them, are used by hundreds of companies to sense human touch.

Others have taken the concept of touch capacitance input further to include decoding user gestures and assigning functions to them. U.S. Pat. No. 7,470,949 by Jobs et al. teaches how gestures using simultaneous touches on a capacitive surface such as "pinching", rotating, and swiping can be used to manipulate onscreen elements. While this approach allows for multiple fingers touching the surface at one time, it is not for the purpose of allowing the user to "rest" their fingers on the surface, but rather for a specific intended action to be performed.

The object coming into contact with the touch sensitive surface may not always be a human finger. For example, other forms of touch sensors such as resistive, surface acoustic wave, and infrared allows passive objects such as a plastic stylus to be used to make selections on the touch surface. It is possible to also apply this concept using capacitive sensors, by designing input objects with capacitive properties similar to a human finger. For example, in U.S. Pat. No. 5,488,204 Mead et al. describe a paintbrush-like input device that is capable of creating brush-like strokes on a display screen. Mead further teaches using X and Y sensor data to determine a Z-value representing finger pressure. Mead's teachings build on the teachings of Miller et al. in U.S. Pat. No. 5,374,787. This method, however, is targeted toward a single input (of either a single finger, stylus, or paintbrush-like input device) and is focused on a touchpad rather than a touch surface that is part of a display or graphical surface. It doesn't apply the concept to the problem of multiple fingers resting directly on the touch surface on which are displayed actionable regions, as disclosed in the present invention.

There are numerous other devices that use force sensors to detect pressure in the Z direction. For example, in U.S. Pat. No. 8,026,906 Molne et al. describe using force-sensing resistors (FSR's) to measure downward pressure on a touch screen, wherein the FSR's are placed between the touch sensitive surface and supporting posts (or feet at all four corners). In U.S. Pat. No. 5,241,308 Young et al. describe a similar method wherein pressure is detected by the deformation between two panels closely spaced apart, or by providing force-sensing means located at each of the spaced apart support. These devices measure the forces transmitted by the touch surface to a fixed frame at multiple points (see also U.S. Pat. No. 3,657,475 to Peronneau et al. and U.S. Pat. No. 4,121,049 to Roeber). These methods detect pressure by a means that is separate from the means to detect touch, whereas the present invention detects touch, resting, and pressing all through the same touch capacitive means.

SUMMARY OF THE INVENTION

The present invention provides systems and methods that allow the user to rest their fingers on a touch-sensitive surface and make selections on that surface by pressing. Touch capacitance sensors that typically provide X and Y location data associated with a user's touch are also used to discern finger pressure in the Z direction. This allows the user to make an actuation on the touch screen by simply pressing harder at a location where they may already be resting their finger(s).

In one aspect of the invention, the process discerns between the actions of tapping on the surface, resting on the surface, and pressing on the surface. It does so using, in part, thresholds for the touch signal (which may be dynamically altered to accommodate the touch signatures of different users). The process also takes into account the rate of the rising edge of the touch signal to discern between a tap, a resting action, and a press.

It is desirable to allow a human user to rest their hands and/or fingers on a touch surface without causing an actuation, yet still allow other actions issued by the user through touch, such as a press, to be interpreted as commands by the system.

One such method takes into account the vibration caused by the user "tapping" on keys and is described in U.S. Patent Publication No. 20090073128 (Marsden et al.) all of its teaching are hereby incorporated by reference. This method accounts for the common user action of striking, or "tapping" a key to actuate it. The present invention furthers this teaching by also allowing a press action on the surface.

BRIEF DESCRIPTION OF THE DRAWINGS

Preferred and alternative examples of the present invention are described in detail below with reference to the following drawings.

DETAILED DESCRIPTION OF PREFERRED EMBODIMENTS

Figure 1:
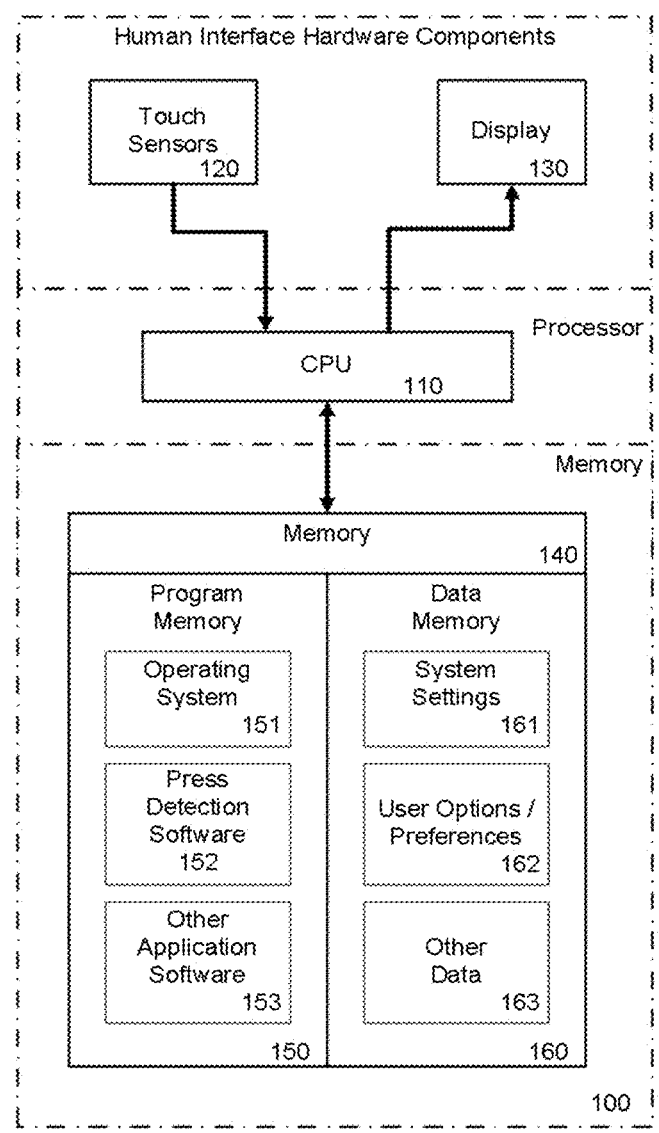
FIG. 1 is a block diagram of an exemplary system formed in accordance with an embodiment of the present invention.

FIG. 1 shows a block diagram of an exemplary device 100 for providing a touch interface that can discern between tapping, resting, and pressing. The device 100 includes one or more touch sensors 120 that provide input to a CPU (processor) 110. The touch sensors 120 notify the processor 110 of contact events when a surface is touched. In one embodiment, the touch sensor(s) 120, or the processor 110, include a hardware controller that interprets raw signals produced by the touch sensor(s) 120 and communicates the information to the processor 110, using a known communication protocol via an available data port. The processor 110 generates an image that is presented on a display 130 (touch surface) or alternatively, the display may be static. The processor 110 is in data communication with a memory 140, which includes a combination of temporary and/or permanent storage, and both read-only and writable memory (random access memory or RAM), read-only memory (ROM), writable nonvolatile memory, such as FLASH memory, hard drives, floppy disks, and so forth. The memory 140 includes program memory 150 that includes all programs and software such as an operating system 151, press detection software component 152, and any other application software programs 153. The memory 140 also includes data memory 160 that includes System Settings 161, a record of user options and preferences 162, and any other data 163 required by any element of the device 100.

The device 100 allows the user to perform at least three interactions on the touch screen: a touch-and-release selection (or a "tap"), a resting action wherein they rest two or more fingers simultaneously on the touch surface, and a pressing action. Being able to distinguish between these three actions significantly improves the flexibility and usefulness of the user interface of the device 100. For example, the touch surface can be used as a keyboard, allowing the user to rest their fingers on it as they would while touch-typing on a traditional keyboard.

Figure 2:
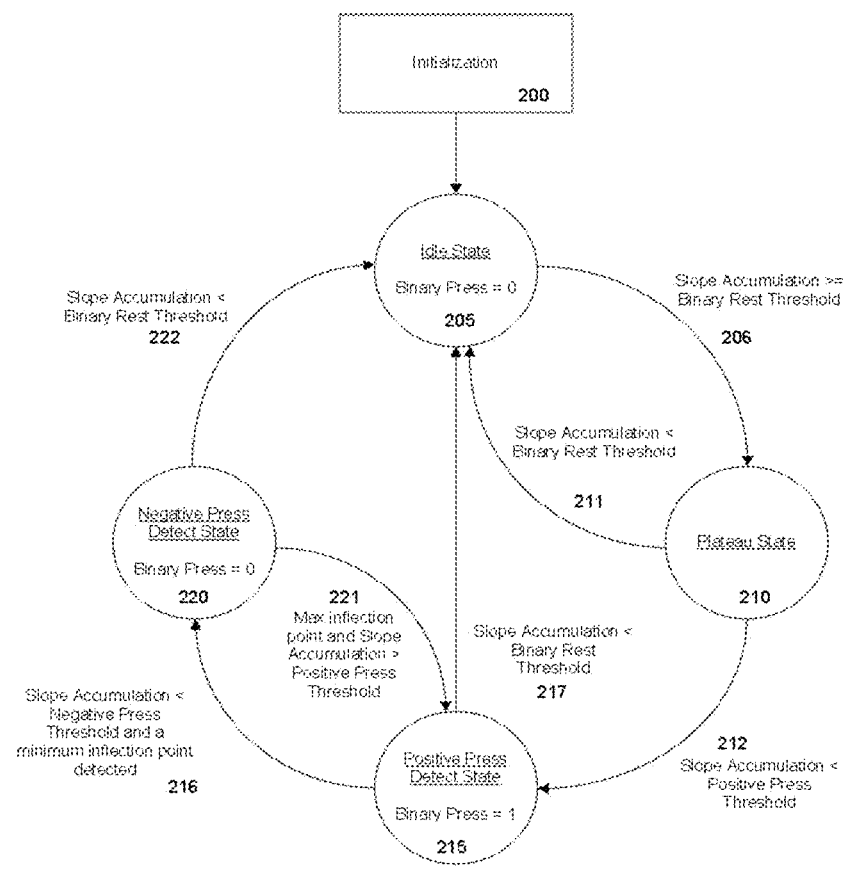
FIG. 2 is a graphical representation of a state machine, detailing the states of resting and pressing.

FIG. 2 is a state diagram that illustrates how a press state is determined by the processor 110. The system is initialized in 200 and then enters the idle state 205 where no touch is detected. When a touch signal is detected, the system begins to measure the accumulation of the signal. When the accumulation reaches a pre-defined threshold called the Binary Rest Threshold in 206, the system proceeds to the Plateau State 210. In the Plateau State 210, the user is deemed to be resting their finger(s) on the touch surface. If the user removes their finger(s) from the surface and the Slope Accumulation drops below the Binary Rest Threshold in 211 then the system returns to Idle State 205. From the Plateau State 210 a user may press their finger harder into the surface causing the Slope Accumulation to continue to increase past a pre-defined Positive Press Threshold 212, upon which the system proceeds to the Positive Press Detect State 215 and asserts a press action. As long as the user maintains the pressure while in the Positive Press Detect State 215, the system maintains the press assertion (similar to holding down a key on a traditional keyboard). Once in the Positive Press Detect State 215, the user may lift their finger(s) from the surface causing the Slope Accumulation to decrease below the Binary Rest Threshold in 217 and the system returns once again to the Idle State 205. However, while in the Positive Press Detect State 215, the user may reduce the pressure of the pressing action without completely removing their finger. In this case, a negative inflection point occurs where the touch signal decreases to a point and then either levels out or begins to increase again (ie. where the slope of the touch signal curve is zero as it passes from negative to positive). When a negative inflection point is detected the system determines if the Slope Accumulation has decreased below a Negative Press Threshold point in 216, at which point the system advances to the Negative Press Detect State 220 and the press action is released. Note that the Negative Press Detect State 220 is similar to the Plateau State 210 in that the user is deemed to be resting. However, the absolute value of the touch signal may be quite different between the two states. When in the Negative Press Detect State 220 the system watches for a maximum inflection point (where the slope of the curve is zero as it passes from positive to negative). When a max inflection point takes place and the Slope Accumulation exceeds the Positive Press Threshold in 221, the system returns to the Positive Press Detect State 215 and asserts a press action. Alternatively, while in the Negative Press Detect State 220, if the Slope signal falls below the Binary Rest Threshold in 222 then the user is deemed to have lifted their finger off the surface and the system returns to the Idle State 205.

Figure 3:
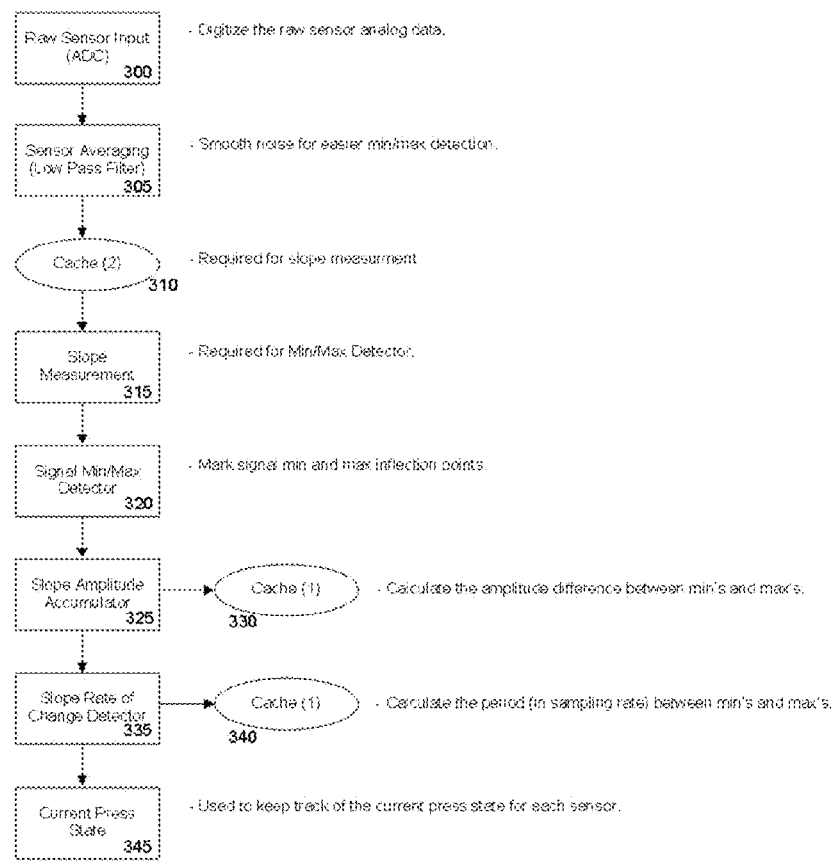
FIG. 3 is a data flow diagram of exemplary processes performed by the system shown in FIG. 1.
Figure 7A:
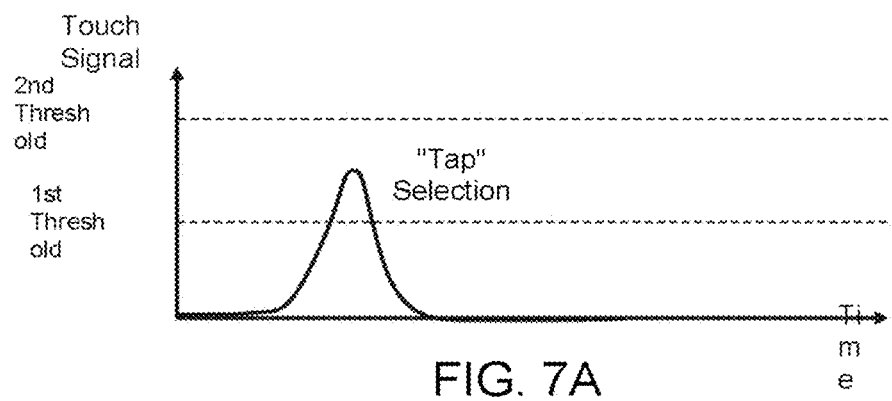
FIGS. 7A, 7B, and 7C are waveform plots of a tap selection, a rest, and a press action, all in the time domain.
Figure 7B:
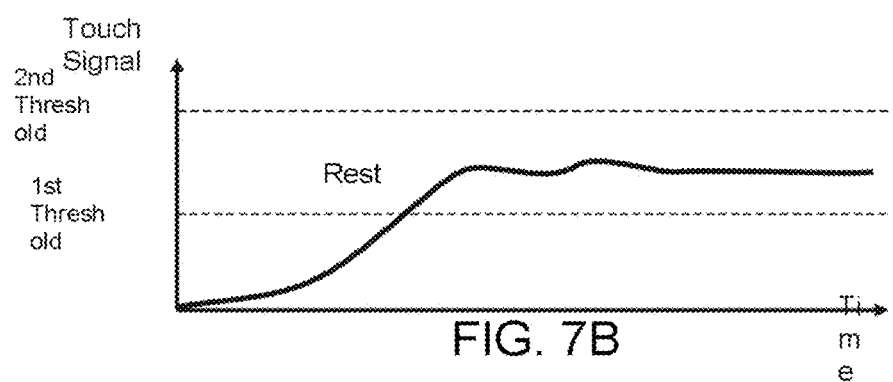
Figure 7C:
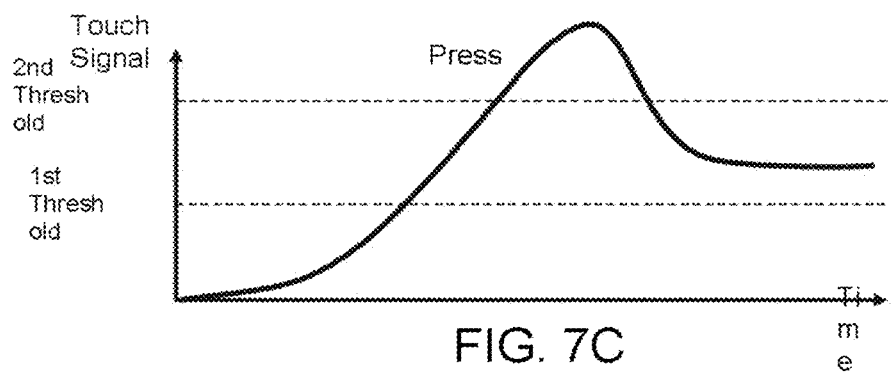

FIG. 3 is a data flow diagram that shows how the CPU 110 measures, stores, and analyzes the touch signal. In block 300 the system acquires the raw sensor data from an analog to digital convertor (ADC). The signal is then passed through a low-pass filter in block 305 in order to smooth out any high frequency noise that may be present in the signal. The result is then stored in a Cache (2) in block 310. The slope of the signal is then analyzed in block 315, followed by detection of the minimum and maximum inflection points of the signal in block 320. In block 325 the system accumulates the slope changes and stores the result in Cache (1) in block 330. This calculation determines the amplitude difference between the min and max inflection points. In block 335, the rate of change of the signal is determined and stored in Cache (1) in block 340. The rate of change of the signal is helpful in determining the difference between a tap selection, a resting set-down action, and a press (as illustrated in FIGS. 7A, 7B, and 7C. In block 345 of FIG. 3, the system determines the current press state.

Figure 4A:
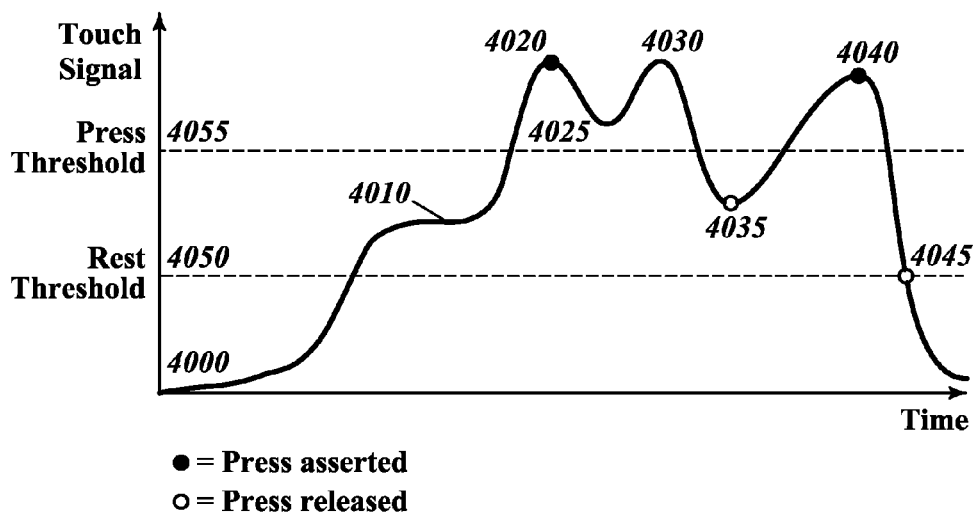
FIGS. 4A and B are plots of waveforms representing the touch signal value in the time domain for various press actions.
Figure 4B:
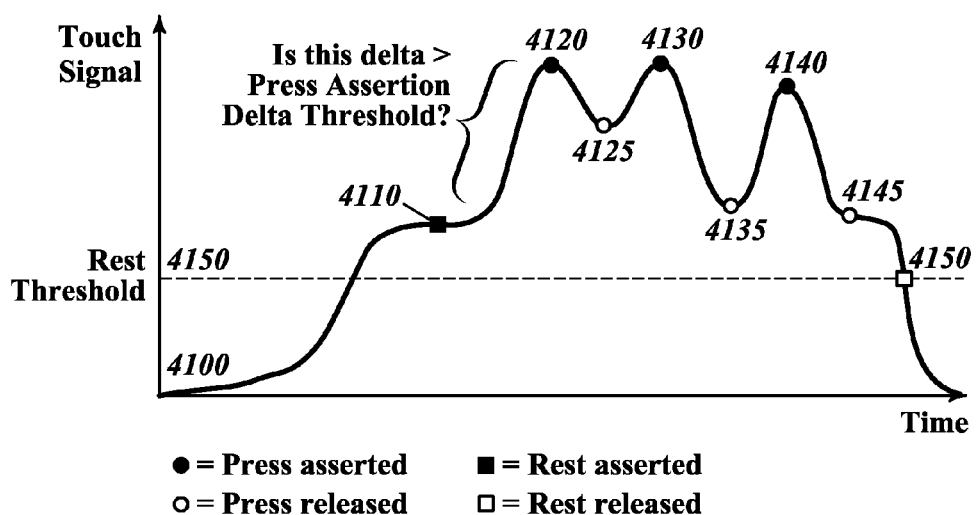

FIGS. 4A and 4B are representations of the touch signal going through a number of conditions resulting in press actions being issued by the system. In FIG. 4A the system follows a very simple process of using fixed threshold values to determine the different between a resting action and a press. The user touches the surface at 4000 causing the touch signal to rise above the pre-defined Rest Threshold 4050, as which point the signal levels off at 4010 causing an inflection point and putting the system into the Plateau State 210. Some time later, the user presses harder on the surface causing the touch signal to increase above the Press Threshold 4055 to a local maxima value at 4020 at which point the system asserts a press action (indicated by the black circle). The system continues looking for maxima and minima inflection points. The inflection points found at 4025 and 4030 are ignored since they occur above the Press Threshold, meaning the press asserted at 4020 continues to be asserted. At 4035 the system detects a minima inflection point that falls above the Rest Threshold 4050 and below the Press Threshold 4055 at which point it asserts a press release action (indicated by the hollow circle). The user then presses again causing the touch signal to increase past the Press Threshold. The system detects the maxima inflection point at 4040 and assets another press action. The user then completely lets go, causing the touch signal to fall back to zero. Although no inflection point is detected, at 4045 the system recognizes that the touch signal has fallen below the Rest Threshold 4050 and assets a press release action.

The method described in the above paragraph associated with FIG. 4A is straight-forward, but fails to discern the possible press action that takes place between 4025 and 4030. When a user performs multiple presses in quick succession, the touch signal often remains above the Press Threshold even on the press release action. In order to remedy this short-coming an embodiment is illustrated in FIG. 4B.

Referring to FIG. 4B, the user touches the surface at 4100 causing the touch signal to rise above a pre-defined Rest Threshold 4150, at which point the signal levels off at 4110 causing an inflection point which the system discerns as a Rest assertion and places the state machine into the Plateau State 210. Some time later, the user presses harder on the surface causing the touch signal to increase to a local maximum value at 4120. The relative change in the signal from 4110 to 4120 is compared with another threshold called the Press Assertion Delta Threshold. If the increase in signal between 4110 and 4120 is greater than the Press Assertion Delta Threshold then a press action is asserted by the system at 4120 (indicated by the solid black circle). Following this assertion, the user decreases the touch pressure between 4120 and 4125 but then once again increases the pressure between 4125 and 4130. At 325, the system detects a minimum inflection point and measures the change in the touch signal between 4120 and 4125 which is then compared with yet another threshold called the Press Release Delta Threshold. If the absolute value of the decrease in the touch signal between 4120 and 4125 is greater than the Press Release Delta Threshold then a release action is asserted by the system (indicated by the hollow circle). A similar process takes place between 4130, 4135, and 4140 only with different amplitudes and rate of change in the signal. Finally, the user stops pressing at 4140 but keeps their finger in contact with the surface in a resting action at 4145, at which point the system asserts a press release action. After some amount of time, the user then removes their finger from the touch surface and the signal quickly falls to zero. As the signal decreases through the Rest Threshold the system asserts a Rest release action at 4150.

In one embodiment the two methods described in FIG. 4A and FIG. 4B may be selectively combined.

Figure 5:
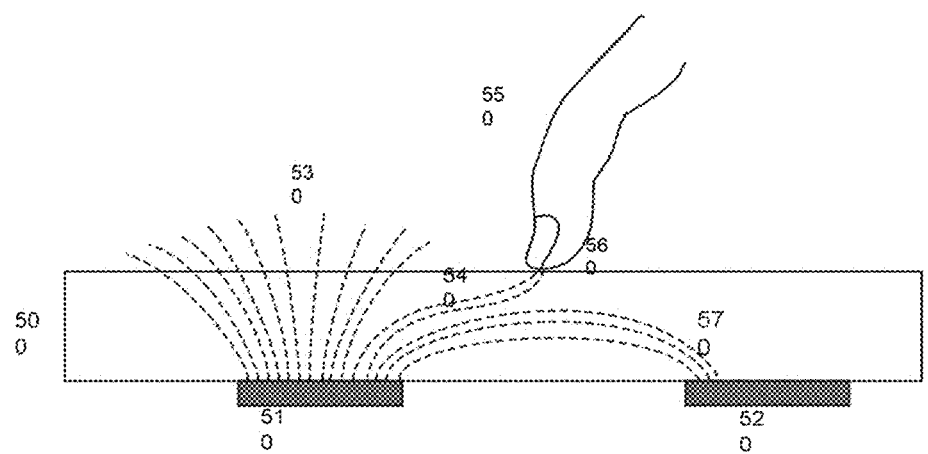
FIG. 5 illustrates the disruption of an electrical field caused by the capacitance of a lightly touching finger.

FIG. 5 illustrates one of many possible embodiments in how a touch-sensitive surface can be implemented using capacitance. A touch-sensitive surface 500 is made up of one or more sensors in which an electrode 510 emits an electrical signal forming an electrical field 530, 540, and 570. An adjacent electrode 520 couples with a portion of the formed electrical field 570. The coupled signal at the adjacent electrode 520 is detected and measured by the system. As a human finger 550 touches the surface 500, a portion of the electrical field 540 couples with the finger, resulting in less of the electrical field 570 coupling with the second electrode 520. The processor 110 receives a digital representation of the analog voltage measurement obtained from the second electrode 520 then detects the change of the signal at the second electrode 520 and determines a touch has taken place. The degree to which the electrical field 540 couples with the human finger 550 is dependent, in part, on the amount of surface area 560 with which the finger comes in contact. A "light" touch is shown in FIG. 5 where the finger 550 is just making contact with the touch surface 500. A relatively lower amount of the electrical field 540 is disrupted by the light touch.

Figure 6:
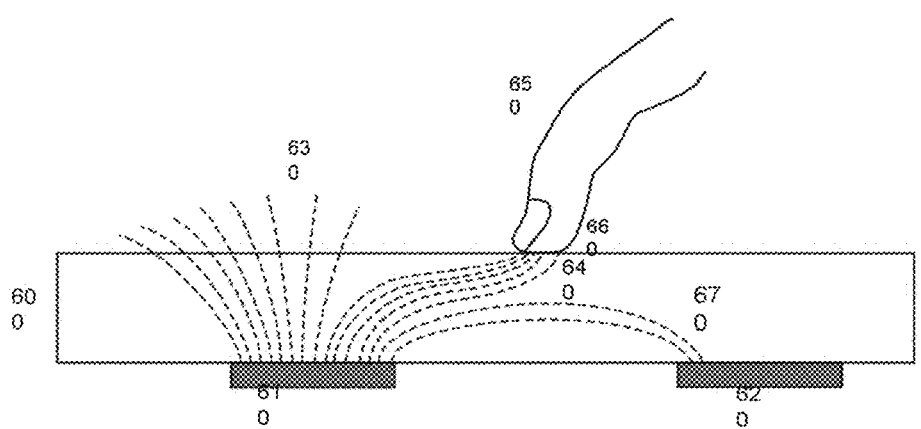
FIG. 6 illustrates the disruption of an electrical field caused by the capacitance of a finger being pressed strongly into the surface.

FIG. 6 illustrates the effects of a stronger press on the touch capacitance signals. A touch-sensitive surface 600 is made up of one or more sensors in which an electrode 610 emits an electrical signal forming an electrical field 630, 640, and 670. An adjacent electrode 620 couples with a portion of the formed electrical field 670. The coupled signal at the adjacent electrode 620 is detected and measured by the system. As a human finger 650 presses hard on the surface 600, a relatively larger portion of the electrical field 640 couples with the finger, resulting in less of the electrical field 670 coupling with the second electrode 620. The processor 110 receives a digital representation of the analog voltage measurement obtained from the second electrode 620 then detects the change of the signal at the second electrode 620 and determines a press has taken place. The degree to which the electrical field 640 couples with the human finger 650 is dependent, in part, on the amount of surface area 660 with which the finger comes in contact. A "heavy" touch, or press, is shown in FIG. 6 where the finger 650 makes strong contact with the touch surface 600 causing the finger to flatten out at 660. A relatively larger amount of the electrical field 640 is disrupted by the pressing action.

FIGS. 7A, 7B, and 7C illustrate the three actions of a tap selection, a resting set-down action, and a set-down press action respectively. Both the amplitude of the touch signal and the slope of the leading edge of the signal are used to determine which action is being initiated by the user. In FIG. 7A the user quickly taps on a key causing the signal to exceed a pre-defined first threshold indicating a valid touch has taken place. The rising slope of the signal is steep, as is the falling edge, and it peaks between the First Threshold and the Second Threshold (the conditions for a "tap" selection). FIG. 7B illustrates the signal that meets the conditions for a resting set-down action. In this case, the rising edge of the touch signal is relatively slow (as compared to a tap signal) and the amplitude of the signal stabilizes between the First and Second Thresholds. FIG. 7C illustrates the signal that meets the conditions for a set-down press action. In this case, the rising edge of the touch signal is relatively slow as compared to the tap signal, but similar in slope to the rising edge of a rest set-down action. However, the amplitude of the signal continues beyond the Second Threshold indicating the user has pressed harder than a normal touch. The slower rise time, but higher amplitude indicates a set-down pressing action has taken place.

Being able to distinguish between a tap selection, a set-down resting action, and a pressing action is critical in allowing the user to rest their fingers on a touch surface. Further, using the same sensors to detect all three actions has the advantages of keeping the cost of the system relatively lower and simpler.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A system comprising:
    a touch sensitive surface comprising a plurality of touch capacitive sensors associated with actionable locations on the touch sensitive surface, wherein each touch capacitive sensor of the plurality of touch capacitive sensors is associated with a respective key of a plurality of keys of a virtual keyboard;
    a processor configured to:
        determine that a user interaction is a selection event when one of one or more signals received from one or more of the plurality of touch capacitive sensors has a leading rising edge with a rate-of-change that exceeds a first rate-of-change threshold followed within a predefined amount of time by a falling edge decreasing in value at a rate-of-change greater than a second rate-of-change threshold;
        determine that a user interaction of resting multiple fingers on the touch sensitive surface is a resting action when multiple signals received from one or more of the plurality of touch capacitive sensors are between a first threshold value and a second threshold value, and the rate-of-change of the leading rising edge of the multiple signals is less than the first rate-of-change threshold and the multiple signals are above the first threshold value, wherein the resting action is not actionable; and
        determine that a user interaction with the touch sensitive surface is a press action on a key of the plurality of keys of the virtual keyboard when one or more signals received from one or more of the plurality of touch capacitive sensors are above the second threshold value.

2. The system of claim 1, wherein the first and second threshold values are predefined.

3. The system of claim 1, wherein the first and second threshold values are variable based on individual touch characteristics of each user.

4. The system of claim 1, wherein the processor is further configured to assert an activation after a determined resting action for a particular user interaction is followed by a determined press action on an actionable location.

5. The system of claim 1, wherein the processor is further configured to
    determine a press and hold event when a determined resting action for a particular user interaction is followed by a determined press action that is sustained for longer than a predefined key repeat time.

6. The system of claim 1, wherein the first and second rate-of-change thresholds are the same.

7. The system of claim 1, wherein the processor is configured to determine that the user action is a resting action when amplitudes of the multiple signals are greater than at least the first threshold value.

8. The system of claim 1, wherein the processor is further configured to determine that the user interaction with the touch sensitive surface is the press action when the rate-of-change of the leading rising edge of the one or more signals is less than the first rate-of-change threshold and the one or more signals are above the second threshold value.

9. The system of claim 1, further comprising an output device configured to present a response corresponding to the press action.

10. The system of claim 1, wherein the processor is further configured to:
    determine that a user interaction with the touch sensitive surface is a tap action on the key of the plurality of keys of the virtual keyboard when a rising slope of one or more signals received from one or more of the plurality of touch capacitive sensors is steep in accordance with predetermined criterion.

11. A system comprising:
    a touch sensitive surface comprising a plurality of touch capacitive sensors associated with actionable locations on the touch sensitive surface, wherein each touch capacitive sensor of the plurality of touch capacitive sensors is associated with a respective key of a plurality of keys of a virtual keyboard; and
    a processor in signal communication with the touch sensitive surface, the processor configured to:
        determine that a user interaction of resting multiple fingers on the touch sensitive surface is a resting action when multiple signals received from one or more of the plurality of touch capacitive sensors are between a first threshold value and a second threshold value, wherein the resting action is not actionable;
        upon determining that the user interaction is the resting action, determine a peak of one of the multiple signals and determine a difference in amplitude of the multiple signals associated with the resting action and the determined peak,
        wherein if the determined difference is greater than a first predefined delta threshold, determine that a user interaction with the touch sensitive surface is a press action on a key of the plurality of keys of the virtual keyboard;
        upon determining that the user interaction is the press action, determine a trough of one of the multiple signals, and determine a difference in amplitude of the multiple signals associated with the press action and the determined trough, wherein if the multiple signals are determined to be at or below the first threshold value, determine that a user interaction with the touch sensitive surface is a rest and release action; and wherein if the trough and the peak have a difference that is greater than a second predefined delta threshold, determine that a user interaction with the touch sensitive surface is a press and release action on the key of the plurality of keys of the virtual keyboard.

12. The system of claim 11, wherein the first and second predefined delta thresholds are the same.

13. The system of claim 11, further comprising an output device configured to present a response corresponding to the press action.

14. A system comprising:
a touch sensitive surface comprising a plurality of touch capacitive sensors associated with actionable locations on the surface, wherein each touch capacitive sensor of the plurality of touch capacitive sensors is associated with a respective key of a plurality of keys of a virtual keyboard; and
a processor configured to:
determine that a user interaction of resting multiple fingers on the touch sensitive surface is a resting action when multiple signals received from one or more of the plurality of touch capacitive sensors are between a first threshold value and a second threshold value, wherein the resting action is not actionable;
determine that a user interaction with the touch sensitive surface is a press action on a key of the plurality of keys of the virtual keyboard when a rate-of-change of a leading rising edge of a signal of one or more signals received from one or more of the plurality of touch capacitive sensors is less than a first rate-of-change threshold and the one or more signals are above a second threshold value;
after determination of the resting action, determine a peak of one of the multiple signals and determine a difference in amplitude of the multiple signals associated with the resting action and the determined peak;
if the determined difference is greater than a first predefined delta threshold, determine that a user interaction with the touch sensitive surface is a press action on the key of the plurality of keys of the virtual keyboard;

after determination of the press action, determine that a user interaction with the touch sensitive surface is at least one of:
a rest and press release action on the key of the plurality of keys of the virtual keyboard, if the multiple signals are determined to be at or below the first threshold value; or
a press release action on the key of the plurality of keys of the virtual keyboard, wherein the processor determines an amplitude of a trough of one of the multiple signals and determines the user interaction is the press release action if the trough amplitude and the determined peak have a difference that is greater than a second predefined delta threshold.

15. The system of claim 14, wherein the first and second predefined delta thresholds are the same.

16. The system of claim 14, further comprising an output device configured to present a response corresponding to the press action.

17. A system comprising:
a touch sensitive surface comprising a plurality of touch capacitive sensors associated with actionable locations on the touch sensitive surface, wherein each touch capacitive sensor of the plurality of touch capacitive sensors is associated with a respective key of a plurality of keys of a virtual keyboard;
a processor configured to:
determine that a user interaction of resting multiple fingers on the touch sensitive surface is a resting action when: (i) multiple signals received from one or more of the plurality of touch capacitive sensors are between a first threshold value and a second threshold value, wherein the resting action is not actionable, and (ii) amplitudes of the multiple signals stabilize when the amplitudes of the multiple signals level off and remain relatively constant for a predetermined amount of time; and
determine that a user interaction with the touch sensitive surface is a press action on a key of the plurality of keys of the virtual keyboard when one or more signals received from one or more of the plurality of touch capacitive sensors are above the second threshold value.

* * * * *